United States Patent
Tisse

(10) Patent No.: US 7,152,085 B2
(45) Date of Patent: Dec. 19, 2006

(54) NON-PHASE SHIFTING BIDIMENSIONAL FILTER

(75) Inventor: Christel-Loic Tisse, Plan de Cuques (FR)

(73) Assignee: STMicroelectronics S.A., Montrouge (FR)

(*) Notice: Subject to any disclaimer, the term of this patent is extended or adjusted under 35 U.S.C. 154(b) by 802 days.

(21) Appl. No.: 10/273,742

(22) Filed: Oct. 18, 2002

(65) Prior Publication Data

US 2003/0076161 A1 Apr. 24, 2003

(30) Foreign Application Priority Data

Oct. 19, 2001 (FR) .................................. 01 13519

(51) Int. Cl.
*G06F 17/10* (2006.01)
(52) U.S. Cl. .................................................. 708/308
(58) Field of Classification Search ................. 708/308
See application file for complete search history.

(56) References Cited

U.S. PATENT DOCUMENTS 5,373,460 A 12/1994 Marks, II
5,572,596 A 11/1996 Wildes et al.
6,119,139 A * 9/2000 Dyba .......................... 708/309

OTHER PUBLICATIONS

French Search Report from French Patent Application No. 01/13519, filed Oct. 19, 2001.

* cited by examiner

*Primary Examiner*—Tan V. Mai
(74) *Attorney, Agent, or Firm*—Lisa K. Jorgenson; William R. McClellan; Wolf, Greenfield & Sacks, P.C.

(57) ABSTRACT

A band-pass filter with at least one passband, which is real, bidimensional, oriented along the phase axis and resulting from the product of two identical one-dimensional Hamming windows, the transfer function of each of these windows being:

$$X_i(f) = \alpha_i + (1 - \alpha_i)\cos\frac{\pi(f - fq_i)}{f0_i}, \text{ where}$$

f is a current frequency;
$\alpha_i$ is a real number, included between and excluding 0 and 1;
$fq_i$ is a central frequency of the passband; and
$f0_i$ defines half of the passband centered on $fq_i$.

7 Claims, 1 Drawing Sheet

NON-PHASE SHIFTING BIDIMENSIONAL FILTER

BACKGROUND OF THE INVENTION

1. Field of the Invention

The present invention generally relates to digital processing. More specifically, the present invention relates to filtering in the frequency domain of digital data.

2. Discussion of the Related Art

Upon processing of digital data in the frequency domain, resulting for example from the application of a Fourier transform to space and time data, filters may have to be applied to several passbands, to extract useful information. This useful information is, for example, intended to enable a coding according to at least two types of data, for example, three: phase, module, and frequency. The present invention will be described hereafter in relation with an example of application to the processing of a digital image. It more generally applies to any type of digital data. In the example, it is more specifically considered in the present description that the data to be coded vary (provide an information which is desired to be exploited) along a single direction of a digital image, for example, along the horizontal line axis. Such an image can itself result from a previous processing.

SUMMARY OF THE INVENTION

The present invention aims at providing a bidimensional digital filter applicable in the frequency domain.

The present invention also aims at providing such a filter which is non phase-shifting, and thus real, that is, the imaginary part of which is zero.

The present invention also aims at providing such a filter which is oriented in the phase direction.

The present invention also aims at providing such a filter, the analytic expression of which includes simple mathematical operations.

To achieve these and other objects, the present invention provides a band-pass filter with at least one passband, which is real, bidimensional, oriented along the phase axis and resulting from the product of two identical one-dimensional Hamming windows, the transfer function of each of these windows being:

$$X_i(f) = \alpha_i + (1 - \alpha_i)\cos\frac{\pi(f - fq_i)}{f0_i}, \text{ where}$$

f is a current frequency;

$\alpha_i$ is a real number, included between and excluding 0 and 1;

$fq_i$ is a central frequency of the passband; and $f0_i$ defines half of the passband centered on $fq_i$.

According to an embodiment of the present invention, the windows are Hanning windows, for which the real number $\alpha_i$ is 0.54.

According to an embodiment of the present invention, the filter has a passband having a width of one octave.

According to an embodiment of the present invention, the passband of each of the Hanning windows is defined by:

$$f0_i = \frac{\pi}{3\arccos\left(\frac{\frac{1}{2} - \alpha_i}{1 - \alpha_i}\right)} fq_i,$$

where ar cos designates the inverse cosine function.

The present invention also provides a band-pass filter with several passbands, each passband of which is conformal to any of the preceding embodiments.

According to an embodiment of the present invention, such a filter is applied to the detection of a texture of a ring-shaped element, the texture being a set of information essentially varying according to the angular position in concentric circles.

The foregoing objects, features and advantages of the present invention, will be discussed in detail in the following non-limiting description of specific embodiments in connection with the accompanying drawings.

DETAILED DESCRIPTION

Figure 1:
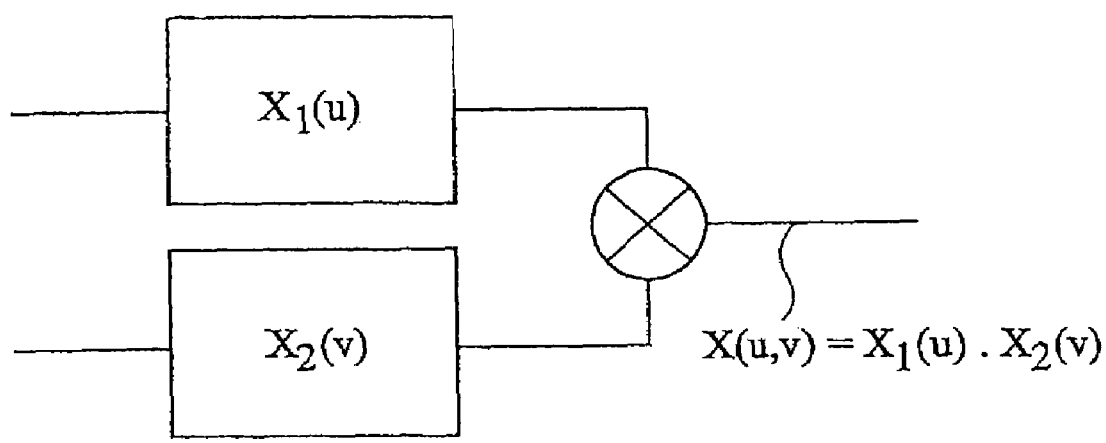
FIG. 1 schematically illustrates in the form of blocks an embodiment of a filter according to the present invention.

As illustrated in FIG. 1, a bidimensional filter according to the present invention is the product of two one-dimensional identical band-pass filters, each forming a Hamming window of respective transfer function $X_1(u)$ and $X_2(v)$. Transfer function $X(u,v)$ of the bidimensional filter thus is: $X(u,v)=X_1(u).X_2(v)$.

Figure 2:
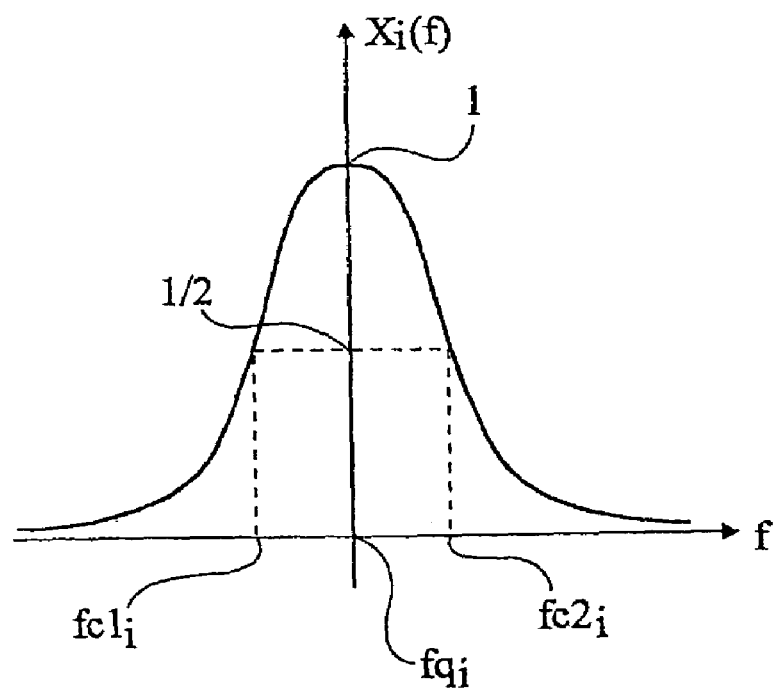
FIG. 2 illustrates the transfer function of a component of a filter according to the present invention.

FIG. 2 illustrates transfer function $X_i(f)$ of a Hamming window in the frequency domain. This transfer function has as analytic expression:

$$X_i(f) = \alpha_i + (1 - \alpha_i)\cos\frac{\pi(f - fq_i)}{f0_i}, \text{ where}$$

f is the current frequency (abscissa axis);

$\alpha_i$ is a real number, generally called the Hamming coefficient, included between and excluding 0 and 1;

$fq_i$ is the central frequency of the band-pass filter, that is, the frequency value for which the response of the band-pass filter is maximum ($X_i(fq_i)=1$); and $f0_i$ defines half of the passband centered on frequency $fq_i$ delimited by frequencies $fc1_i$ and $fc2_i$ for which the filter response is half of the maximum value ($X_i(fc1_i)=X_i(fc2_i)=\frac{1}{2}$). Frequencies $fc1i$ and $fc2i$ delimit the spectrum spreading to −3 dB with respect to central frequency $fq_i$ and are determined by value $f0i$.

According to a specific embodiment of the present invention, the filter has a passband having the width of an octave.

Then, with the preceding notations, the passband of the one-octave filter is obtained if value $f0_i$ is equal to:

$$f0_i = \frac{\pi}{3\arccos\left(\frac{\frac{1}{2} - \alpha_i}{1 - \alpha_i}\right)} fq_i$$

where ar cos designates the inverse cosine function.

Preferably, the Hamming windows are so-called Hanning windows for which coefficient $\alpha_i$ is 0.54.

An example of application of such a filter is to isolate the spectral components of a digital image according to a given direction.

For example, the iris of an eye is characterized by texture information which vary according to circles included between the pupil and the limit between the iris and the cornea. The coding of the information of an iris is then performed as follows.

First, the circular information is unfolded in linear information, for example, horizontal, by a constant angle polar conversion. Then, a Fourier transform is applied to the image resulting from the conversion. The discrete values obtained in the frequency domain are then submitted to various known digital processes to enable subsequent coding, for example, discussed in U.S. Pat. Nos. 5,291,560 and 5,572,596 or in international patent application Ser. No.00/62239, which are incorporated herein by reference.

Applying the filter according to the present invention to the discrete values resulting from the Fourier transform has many advantages in terms of simplicity and reliability with respect to known methods. Indeed, as appears from the foregoing description, the most complicated mathematical operations of a processing by the filter according to the present invention are the calculations of a cosine as well as of the inverse of a cosine to define the passband based on central frequency fqi. Known methods use more complicated mathematical functions, especially exponential, which require more time and software space. Further, the filter according to the present invention being non phase-shifting, it enables very fast extraction of the phase data by relatively simple demodulation methods. In particular, it enables applying a so-called Hilbert transform which enables simultaneously obtaining all coding data. The code in module, phase, and frequency is then transferred to the spatial and temporal field by applying an inverse Fourier transform.

The use of a filter according to the present invention further enables increasing the reliability of the performed coding. Indeed, the succession of long and/or complex operations of known methods being replaced with simple and fast calculations, less approximations are made and/or it is possible in the same processing time to code more data of the initial image.

In the previously described application of the coding of an iris, the code in module, phase and frequency enables iridian recognition usable as a recognition parameter to identify an individual. An example of application is the access control: access to a physical site, such as the controlling of the opening of a door with a code, or with an access card; access to a bank account usually protected by a password; access to any device such as a computer or a portable phone usually protected by a code to be typed. Such a device may also replace the fingerprint identification or another biometric identification.

Preferably, a filter with several passbands including three central frequencies distributed to be separated by an octave, for example, 7, 14, and 28 cycles per image, is used in such a processing. Such a filter with several passbands is formed of the sum of three band-pass filters according to the present invention.

Of course, the present invention is likely to have various alterations, modifications, and improvement which will readily occur to those skilled in the art. In particular, a filter according to the present invention applies in other fields than the iris recognition. For example, it may be applied in any detection of a texture of a ring-shaped element, the texture being characterized by information to be coded which varies according to the angular position in concentric circles.

More generally, the filter according to the present invention is usable in any application requiring a non phase-shifting bidimensional band-pass filter oriented along the phase axis.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A band-pass filter in the frequency domain with at least one pass band, which is real, bidimensional, oriented along a phase axis and resulting from the product of two identical one-dimensional Hamming windows, a transfer function of each of these windows being:

$$X_i(f) = \alpha_i + (1 - \alpha_i)\cos\frac{\pi(f - fq_i)}{f0_i},$$

where:
f is a current frequency;
$\alpha_i$ is a real number, included between and excluding 0 and 1;
$fq_i$ is a central frequency of the passband; and
$f0_i$ defines half of the passband centered on $fq_i$.

2. The filter of claim 1, wherein the windows are Hanning windows, for which a real number $\alpha_i$ is 0.54.

3. The filter of claim 1, wherein the filter has a passband having a width of one octave.

4. The filter of claim 3, wherein the windows are Hanning windows and wherein the passband of each of the Hanning windows is defined by:

$$f0_i = \frac{\pi}{3\arccos\left(\frac{\frac{1}{2} - \alpha_i}{1 - \alpha_i}\right)} fq_i,$$

where arcos designates the inverse cosine function.

5. A band-pass filter with several passbands, wherein each passband is defined by claim 1.

6. The filter of claim 1, wherein such a filter is applied to a detection of a texture of a ring-shaped element, the texture being a set of information varying according to an angular position in concentric circles.

7. The filter of claim 1, wherein the filter is used to process a digital image.

* * * * *